ULTRA HIGH SPEED PARAMETRIC DIGITAL CIRCUITS

Filed June 19, 1961 3 Sheets-Sheet 1

INVENTOR:
WOO F. CHOW,
BY Dudley T. Heady
HIS AGENT.

INVENTOR:
WOO F. CHOW,

BY Dudley T. Ready
HIS AGENT

INVENTOR:
WOO F. CHOW,
BY Dudley T. Ready
HIS AGENT.

United States Patent Office 3,292,000
Patented Dec. 13, 1966

3,292,000
ULTRA HIGH SPEED PARAMETRIC DIGITAL CIRCUITS
Woo F. Chow, Philadelphia, Pa., assignor to General Electric Company, a corporation of New York
Filed June 19, 1961, Ser. No. 118,003
10 Claims. (Cl. 307—88)

This invention relates to solid state digital computer circuits applicable to operations at ultra high bit rates. In particular, a novel logic component having gain is disclosed capable of performing a variety of logic operations while processing the information signals without attenuation. The invention makes application of parametric type amplifiers to novel digital computer circuit configurations.

At the present time, the application of conventional computer techniques to ultra high speed circuits encounters several obstacles. Transistors are generally unsuitable because of frequency and power dissipation limitations. Similarly, conventional diode logic is impractical due to wire capacity and the inductive impedance of the diodes which increase the power requirements. While the development of improved semiconductors and circuit techques may extend the speed considerably, fundamental considerations lead one to the conclusion that novel modes of digital circuit operation are required to obtain speeds in excess of $10^8$ bits per second.

One new technique suggested has been the application of parametric circuits utilizing subharmonic oscillators as disclosed in British Patent 778,883, and U.S. Patent No. 2,815,488, Dec. 3, 1957, issued to Von Neumann. These systems utilize an arrangement of subharmonic oscillators which are supplied by RF pulses from a three phase pump source (or as an alternative, the D.C. bias of the diodes are pulsed in series). The oscillators are connected in series and in sequence to the three phase pump source whereby oscillations are built up in the oscillators during a driving phase in accordance with a "seeding" signal of a particular phase. By the insertion of logic networks between stages, appropriate logic operations can be performed to provide the "seeding" signal or information. The arrangement described in the above British and U.S. patents requires approximately 20–40 cycles of the pump frequency for each bit of information. Thus, circuits operating at $10^8$ bits per second rates require pump sources of 2–4 kmc. Pump frequencies of this high order of magnitude are difficult to keep in proper phase and the electromechanical problems involved are difficult to overcome. The present invention seeks to lessen the required magnitude of pump frequency in a digital computer employing parametric amplifiers.

A principal object of this invention is to provide a simple parametric digital circuit with a low ratio of pump frequency to bit rate.

Another object of this invention is to provide practical high speed circuit configurations employing the phase-coding principle to perform basic digital operations.

A further object of the present invention is to provide a practical flip-flop for high speed operation employing the parametric principle.

Briefly stated, in accordance with one aspect of my invention, a logic gain component is provided by a novel assemblage of elements. A logic matrix responsive to one or more phase coded sinusoidal information signals produces an output which is phase coded in accordance with the desired logic. An isolator provides unilateral forward signal passage from the logic matrix to a degenerate case parametric amplifier which has a common input and output terminal. The parametric amplifier produces at the terminal an amplified phase coded sinusoidal signal as an output signal. Preferably, the input is closely regulated by a limiter connected between the isolator-output terminal and the parametric amplifier.

The principal advantage of my invention is that the ratio of pump frequency to bit rate may be substantially reduced by at least one order of magnitude in comparison with the previously published methods. Consequently, many of the practical problems associated with the mechanical design of UHF and microwave computers using the previously published methods are greatly alleviated. This invention, while permitting $10^8$ bits per second rate computers using non-mircowave components, is also applicable to computers whose bit rates correspond to the higher true "microwave" frequencies.

In accordance with another aspect of the invention, a group of three logic gain components two performing AND and the third an OR functions, are interconnected to provide a novel flip-flop with a high response rate.

The invention will be better understood from the following description taken in connection with the accompanying drawings and its scope will be pointed out in the appended claims:

FIGURE 1A illustrates a train of D.C. pulses representing binary data. FIGURE 1B illustrates a sinusoidal wave form representing the binary data of FIGURE 1A in phase coding. FIGURE 1C illustrates a sinusoidal wave form in phase coding which is a contraction of the wave form of FIGURE 1B in that each cycle of carrier contains one bit of information;

Figure 1A:
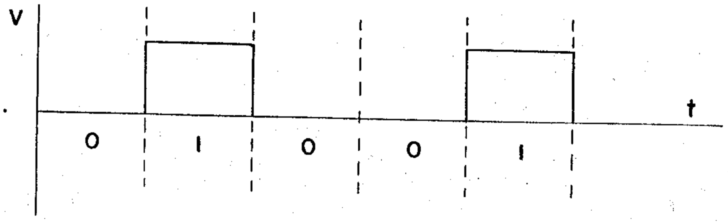
Figure 1B:
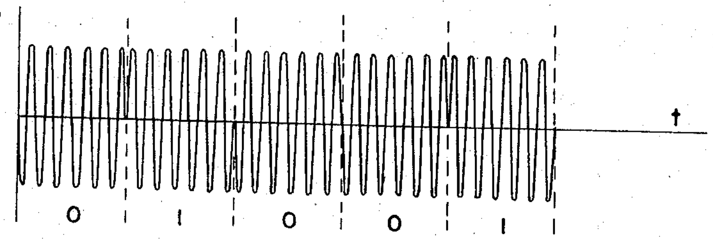
Figure 1C:
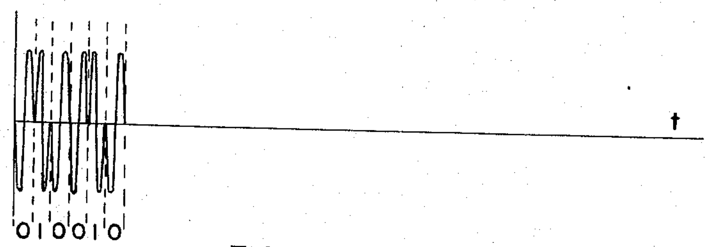

Binary data may be realized in several forms. The most common form is the presence or absence of a D.C. pulse of the idealized type shown in FIGURE 1A. Another form is shown in FIGURE 1B in which the phase of a waveform is utilized to indicate binary data. A sinusoidal waveform wherein the wave is phase coded in either 0° or 180° phased relationship to the clock period of the calculator is suitable. FIGURE 1C shows the scheme of FIGURE 1B in an optimum form from the point of view of maximization of the information content in this type of phase coding. Here, one bit of data is represented by a single cycle of the waveform. A preferred mode of operation of the disclosed system utilizes data in the phase coded form wherein one cycle of the waveform represents one bit of information.

Figure 2:
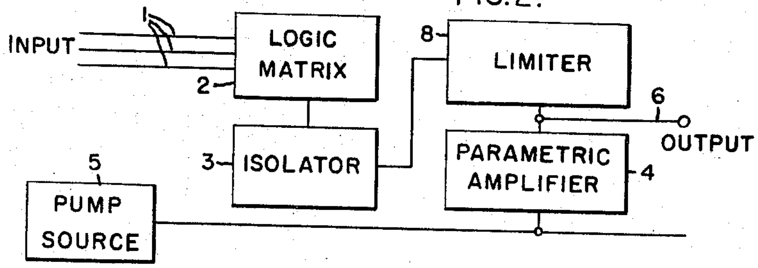
FIGURE 2 is a block diagram of a digital parametric logic gain component in accordance with the present invention.

A block diagram of the basic parametric digital logic gain component is shown in FIGURE 2. Input lines 1 are connected to a logic matrix 2 which may be of a construction suitable for high bit rate operation as described hereinafter. The function of the matrix is achieved by combining or repeating sinusoidal signals coded in phase from input circuits to produce an output representative of the desired logic operation also coded in phase. The output of the logic matrix is connected to an isolator 3 which may be a transistor, gyrator, or a circulator. The output of the isolator 3 is connected to a parametric amplifier 4 which is driven by a common pump source 5 that provides a constant frequency driving source at twice the frequency of the logic matrix output. This pump source supplies pump power to the parametric amplifier continuously without interruption. The output of isolator 3 is preferably connected through a limiter 8. The output of the parametric amplifier is made available on line 6.

The parametric amplifier and the isolator perform several essential functions.

The input signal must be amplified. This function is provided primarily by the isolator although some amplification may be introduced by the parametric amplifier.

The output must be in the correct phase relative to the reference, that is, reclocked. The parametric amplifier is of the "degenerate" case type wherein the input and output frequencies are the same. The degenerate case parametric amplifier has been found to inherently maintain synchronization of the data signal with the pump source, the latter providing the reference time base of the machine. However, to obtain maximum operating rates for a particular circuit, it is necessary to provide external limiting.

The amplitude of the output must be maintained at a reference level. Since the output signal will normally be combined with other signals to perform logic operations, it is essential that the signals be at reference level. The isolator and parametric amplifier combination may be adapted to contribute to the amplitude regulating function.

Each logic matrix must be isolated from subsequent stages. The isolator provides only forward signal propagation from the logic matrix to the parametric amplifier. Transistors such as types 2N502, 2N559, 2N1094, 2N1141, and 2N1194 are satisfactory isolators at bit rates of 100 mc. and provide sufficient amplification. It is necessary that the bandwidth of the amplifier be sufficient to maintain the correct phase information and to respond to the information at the desired bit rate. As more fully discussed hereinafter, a normalized bandwidth equal to the bit rate frequency for the parametric amplifier is sufficient.

Figure 3:
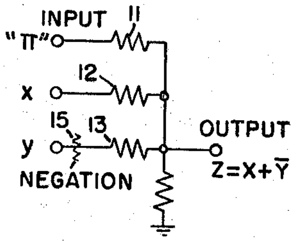
FIGURE 3 is a representation of a typical form of a logic matrix particularly advantageous in the logic gain component of FIGURE 2.

The logic matrix 2 in FIGURE 2 is a simple resistance matrix of the family of devices responsive to phase coded information such as illustrated in FIGURE 3. Here the resistance matrix comprises resistances 11, 12 and 13, an output resistance 14 and a negation element 15 connected to one terminal of resistance 13. One terminal of the resistance 11 is adapted for connection to a source of constant phase signals. One terminal of resistance 12 and the remaining terminal of the negation element 15 are adapted for connection to suitably phase coded input signals. The remaining terminals of each of resistances 11, 12 and 13 are connected to the output terminal of the matrix. The load resistance 14 is coupled between the output terminal and ground.

The resistance matrix illustrated in FIGURE 3 is a majority gate performing the OR operation when the constant phase signal is of "$\pi$" phase as illustrated. As indicated subsequently, this phase responsive matrix and the elements thereof are selected to be suitable for high rate operation.

From a logic standpoint, the most important feature of the majority gate is its versatility. On the one hand, it is easily converted into either an AND or an OR gate while as a majority gate it is itself ideally suited for circuits involving arithmetic operations.

The simplest majority gate is, of course, the three-input gate whose output is always equal to the majority of its three-input values, i.e., $$M(A,B,C)=A\cdot B+A\cdot C+B\cdot C \qquad (3\cdot 1)$$

where M is the majority function.

This function has the property:

$$M(A,B,1)=A+B \qquad (3\cdot 2)$$

and $$M(A,B,O)=A\cdot B \qquad (3\cdot 3)$$

Thus, by simply tying any one of the three-inputs to the appropriate source of the constant (1 or 0) signal, either a two-input OR or a two-input AND gate is obtained. Since most of the literature on logical circuit synthesis and minimization is in terms of AND and OR gates, and show that such techniques can also be applied to synthesis using majority gates. However, in practice the use of majority gates often leads to even simpler circuits than those obtained by the above cited AND and OR procedures.

First, consider some additional logical properties of the majority gate. In general, a majority gate will have an odd number of inputs. If this number is denoted by $2n-1$, it follows that the gate will have a one on its output if and only if there is a one on at least $n$ of its inputs. For the case of a 3-input gate ($n=2$) such as that of FIGURE 3 it was seen that by tying one input branch not having a negation element i.e., 11, to a source of a constant signal, two logical elements (i.e., the AND and OR gates) are obtained. Thus, if the constant signal of "0" phase and of unit amplitude is fed to resistance 11 then the output will be "$\pi$" phase only when the remaining inputs are of "$\pi$" phase. Hence, this is an AND gate for signal inputs to resistances 12 and 13.

An OR gate can be obtained by feeding a "$\pi$" phase signal of unit amplitude to resistance 11. The output will then be of "$\pi$" phase if any one of the remaining inputs is of "$\pi$" phase.

Using a transformer as the negation element 15 or the equivalent of a transformer is strip line techniques for higher frequency, the relative phase of a signal with respect to the reference can be reversed from "0" to "$\pi$" or "$\pi$" to "0." Thus a negation element is obtained. All other logic can be built with the negation element and the elementary AND and OR gates. For example, the logic operation given by: $z=x+\bar{y}$ can be obtained with the configuration illustrated in FIGURE 3.

Special high frequency resistors made of carbon film are commercially available. However at VHF. the circuits are normally operated at low impedance levels of the order of one hundred ohms. At this impedance level, stray circuit capacitance and small lead inductance have little effect. Hence, even some of the ordinary standard carbon resistors can be used at these frequencies with a negligible amount of error. Standard ¼ watt carbon composition resistors ranging from 50 to 500 ohms were experimentally measured to study the reactive effects at high frequencies. The resistance values change less than 10% for frequencies up to 200 mc. The equivalent reactance in shunt across the resistance produces a maximum phase shift of six degrees over a 200 mc. frequency range. Hence with proper care in circuit layout it is still practical to use standard carbon resistors to form an analog majority logic element at 100 mc. For bit rates appreciably higher than this, strip line techniques can be used.

Figures 4A, 4B:
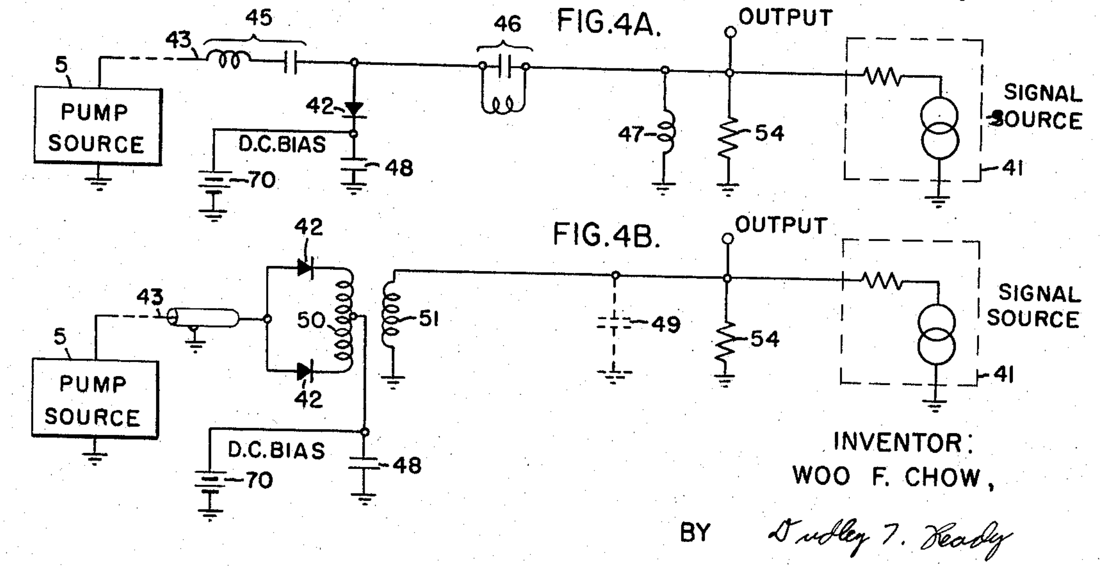
FIGURES 4A, 4B and 4C are schematic illustrations of parametric amplifiers particularly adapted for use in the logic gain component of FIGURE 2.
Figure 4C:
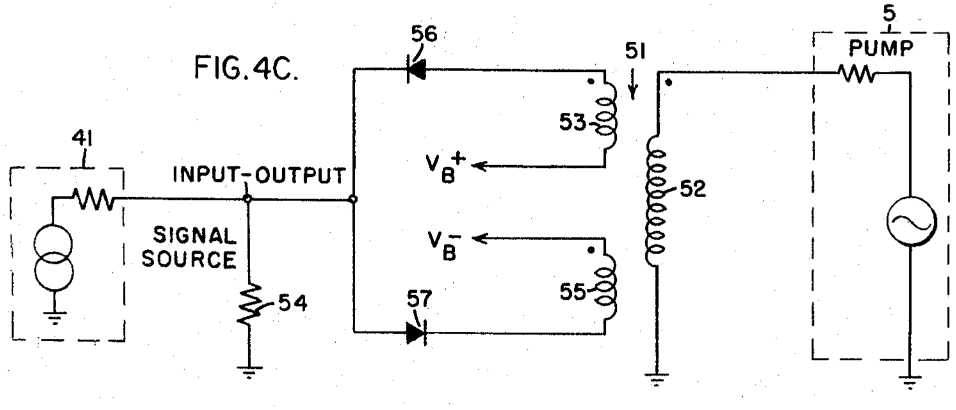

FIGURES 4A, 4B and 4C illustrate parametric degenerate case amplifiers suitable for use in the logic gain component of FIGURE 2. In the embodiment of FIGURE 4A, a pump source 5 through a lead 43 is connected to a series resonant circuit 45 which is resonant at the pump frequency. The other end of the series resonant circuit 45 is connected to a parametric diode 42. The diode 42 functions as a variable capacitance and is connected to ground through an RF bypass capacitor 48. The diode is reversely biased by connection to the D.C. bias source 70. Both the diode bias and the pump supply are applied continuously. A signal source 41 is also connected across the parametric diode 42 through a parallel resonant circuit 46 which is resonant at the pump frequency. A load resistance 54 and an inductance 47 are connected to ground in parallel with the output of the signal source.

The circuit of FIGURE 4A operates as a degenerate case parametric amplifier in which the signal frequency is the same as the idling frequency and where both are equal to exactly half of the pump frequency. As indicated previously, the selection of this type of parametric amplifier has the particular utility in that it inherently remains in synchronism with the pump source. The pump frequency is applied to the parametric diode 42 through the filter 45 which has a series resonance at the pump frequency. The source signal which will be one-half the frequency of the pump frequency is also applied to the parametric diode 42.

The filter 46 rejects the pump frequency at which it is parallel resonant. The resonant circuit 46, together with the capacitance of diode 42 and the inductance 47, provides a parallel resonant circuit at one-half the pump frequency exhibiting a voltage maximum at the point of connection of the load 54. Since the diode 42 operates as a variable capacitive reactance, the capacitance varies as a non-linear function of the applied pump voltages giving rise to the well known parametric amplifying effect. The indicated selection of frequencies and circuit components provide stable operation due to the loading of subsequent circuits on the amplifier.

Parametric diodes for use at the indicated frequencies may be employed. An example is the type Pc–115–10, produced by Pacific Semiconductor Products or MA 460 B, produced by Microwave Associates, Inc. For a further explanation and description of parametric amplification reference is made to the articles: S. Bloom and K. K. N. Chang, "Theory of Parametric Amplification Using Non-linear Reactance," RCA Review, vol. 18, December 1957, J. M. Manley and H. E. Rowe, "Some General Properties of Non-linear Elements," Proc. IRE, vol. 44, p. 904, July 1956; and H. Heffner and G. Wade, "Gain, Bandwidth, and Noise Characteristics of the Variable Parameter Amplifier," Journal of Applied Physics, vol. 29, pp. 1321–1331, September 1958.

A preferred parametric amplifier circuit is shown in FIGURE 4B which operates in a manner generally similar to that of FIGURE 4A. The parametric diodes in this embodiment are connected in a bridge arrangement across the inductance 50. The D.C. bias of the diode is fed through the center tap of inductance 50. Both the bias and the pump source are on continuously without interruption. This arrangement obviates the functions of filters 45 and 46 since the bridge isolates the signal source 41 from the pump frequency and the pump from the signal frequency. The source 41 supplies a signal to the diodes through an inductance 51 inductively coupled to the inductance 50. In this embodiment, a first parallel resonant circuit is formed by stray capacitance illustrated in dotted form by element 49 and the inductance 51 and a second parallel resonant circuit is formed by the capacitance of diodes 42 and the inductance 50. The resonant frequencies will be at or near the signal frequency. The pump is coupled to the diodes 42 and is adapted to apply sufficient voltage thereto without the requirement of a distinct resonant circuit. It has been found that the bandwidth response of the amplifier can be extended by varying the resonant frequencies of the individual tuned circuits from the signal frequency.

Figure 8:
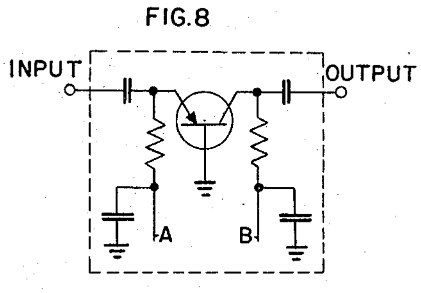
FIGURE 8 is a schematic diagram of an isolator suitable for use in the logic gain component of FIGURE 2.

FIGURE 4C is a schematic diagram of a third embodiment of a parametric amplifier. A pump source 5 is coupled to a diode circuit by a balanced transmission line type transformer 51 through primary winding 52. The proximate terminals of secondary windings 53, 55 are connected to opposite polarity D.C. voltage sources $V_B^+$, $V_B^-$. The remaining terminals are connected in series with nonlinear, parametric diodes 56 and 57 which are poled in the same direction relative to the bias voltage sources. Input and output signals appear at a common input-output terminal between the two diodes. A source of input signals 41, such as a transistor isolator illustrated in FIGURE 8, is connected to the common terminal in parallel with a load resistor 54. Output signals are connected to the logic matrix (or equivalent) of a subsequent logic component by a transmission line connected across the load resistor 54.

The operation of the FIGURE 4C circuit may be described in terms of conventional parametric amplification as above for FIGURES 4A and 4B. The pump signal from source 5 and the input signal at half the pump frequency from source 41 are mixed in the nonlinear parametric diodes 56 and 57. The parametric amplification effect is dependent upon the nonlinear changes of capacitance with applied voltage. However, optimum performance has been obtained with a sharp capacitance transition characteristic for the parametric diodes and with minimum reactance in the circuit to maximize the bandwidth of the device. Accordingly, in some respects it is more meaningful to analyze the circuit operation as that of a reactive switch. The operation of the circuits of FIGURES 4A and 4B can also be considered in terms of reactive switching. For this reason, whether the effect produced by the pump voltage on the parametric diodes is most accurately considered in terms of mixing or switching, the circuits of FIGURES 4A, 4B and 4C and equivalents are denominated parametric amplifiers. Such an analysis is based upon considering the parametric diodes 56, 57 as approximating a device having two capacitance states in accordance with the pump voltage, with the transition between states being so abrupt as to be neglected.

Figure 5A:
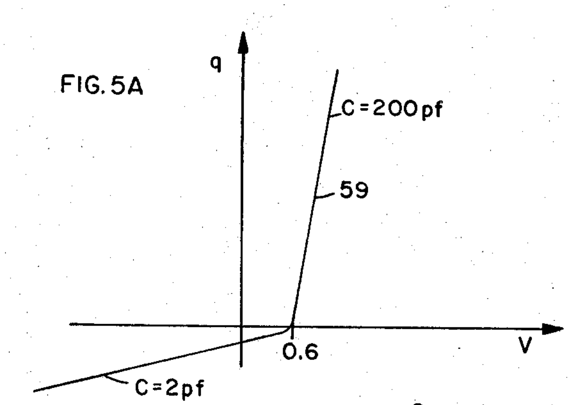
FIGURE 5A is an idealized graph of the parametric diode charge as a function of applied voltage.

FIGURE 5A is an idealized graph of diode charge $q$ as a function of applied voltage $v$ for an actual parametric diode. The curve 59 of diode charge has a transition at the zero charge, 0.6 v. point. For voltages less than 0.6 v., the parametric diode has a dynamic capacitance of 2 pf. (micro-micro-farads) and for higher voltages, the dynamic capacitance is 200 pf.

Because of the balanced nature of the FIGURE 4C circuit, the output voltage is zero, in the absence of an input current, when the pump voltage is applied. The relation between the bias voltages $V_B^-$, $V_B^+$ and pump is such that the diodes 56 and 57 are in the high capacitance state the major portion of the pump cycle. However, input currents will switch one of the diodes for approximately the last quarter of the pump cycle and output pulses will then be produced. The output voltage is equal to half the difference of the voltages across the diodes because when the diodes are in the high capacitance state, there is virtually no voltage across them.

Figure 5B:
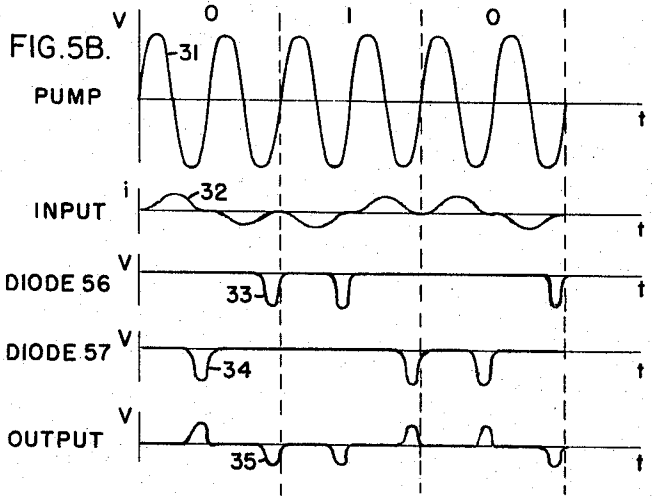
FIGURE 5B is a series of representative waveforms occurring in the operation of the FIGURE 4C circuit.

FIGURE 5B is a graph of various waveforms in the FIGURE 4C type parametric amplifier as a function of time. Curve 31 is the sinusoidal pump voltage which drives the parametric diodes at twice the bit rate frequency. Curve 32 represents the sinusoidal input current which is applied in synchronism with the pump. The interaction of the pump and the input current is such as to switch diodes 56, 57 during the last quarter of each pump cycle. This results in the voltage waveforms 33 and 34 which correspond respectively to the voltages across diodes 56 and 57. However, because of the transient response characteristic of parametric diodes, the voltage spikes lag the pump voltage by approximately 90°. The effect of the diode switching is to produce an output voltage represented by curve 35. The output pulses closely approximate raised cosine pulses and the pair produced in each bit cycle, of opposite polarity together approximate a sinusoidal waveform. Because of the direct relationship between the pump voltage and the output waveform, the reclocking and reshaping properties of the circuit are excellent.

The pass band of the parametric amplifier of the logic component is dictated by several considerations and should extend from 25 mc. to 150 mc. for a 100 mc. bit rate. One factor is that the frequency components produced in parametric subharmonic amplifiers are always generated in pairs symmetric about the subharmonic frequency. This results in frequency interactions. For example, with a 100 mc. subharmonic frequency, any attempt to change the 150 mc. component will inevitably affect the 50 mc. component also. Therefore, it is necessary that the bandwidth at the output be approximately symmetrical about the subharmonic frequency and include the highest and lowest frequencies necessary to transmit the phase script information. In the operation of a logic component, it is necessary to handle all possible sequences of information. For example, a sequence such as 1010 contains no frequency components between 75 mc. and 125 mc. However, satisfactory operation can be obtained with the two major frequency components 50 mc. and 150 mc. In practice, this type of sequence has proved the most demanding, and it has been established that a bandwidth extending from 25 mc. to 150 mc. is satisfactory and some reduction is possible if the output is subjected to hard limiting. In order to obtain the necessary large bandwidth, resonant operation is to be minimized.

It has been found that under certain circumstances succeeding input signals can interfere. The cause of this interference is the accumulation of a net charge over a cycle on the parametric diodes. This accumulation can be explained by the diffusion of charge carriers through the diodes when discharge is not sufficiently rapid. To avoid this, the bias voltages can be adjusted to discharge the diodes for a given input signal level. However, since the input signals are inherently variable in a logic system, it is necessary to maintain the input signals within given limits. (An example of the variation in input signals in a logic system is presented by a two input majority OR gate. Here, when both inputs are 1, the combined signals are three times the combined signal where only one input is a 1.) It is for this reason that it is essential to maintain the input signals uniform. When the parametric amplifier circuit provides a limiting function and/or provides power gain, the output charge is relatively reduced and the recovery or discharge time is relatively increased. Since this recovery time is determined by the diode capacitance and the load resistance, an increase in pump frequency will not decrease the recovery time.

Figure 6:
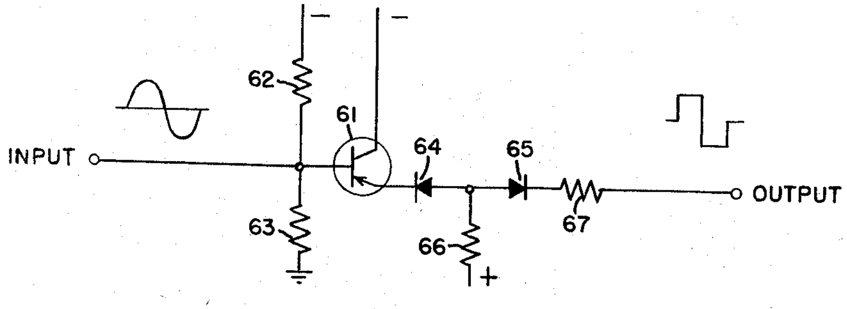
FIGURE 6 is a schematic diagram of a limiter suitable for use in a logic component which includes a parametric amplifier such as that shown in FIGURES 4A, 4B and 4C.

FIGURE 6 is a schematic diagram of one type of limiter circuit which is suitable for use in conjunction with the novel logic component to provide uniform amplitude output signals. In this circuit, the input signal is coupled to a transistor 61 providing a low impedance source for the limiting diodes which is connected in an emitter follower configuration. The input is connected to the transistor base and to the junction of a pair of bias receivers 62 and 63. The output signal is connected in series with a pair of junction-diodes 64 and 65 which are poled in opposite directions. A bias source is connected to a common terminal between the diode 64, 65 through a bias resistor 66 in order to bias the diodes in the forward direction. The output of the circuit is delivered through a load resistor 67 to the parametric amplifier.

The FIGURE 6 circuit operates as a series limiter which is capable of limiting at the required speed with the required high limiting ratio. The operation of the circuit is dependent upon the diodes presenting larger impedance for larger amplitude signals. The impedance level referred to is relative to the load impedance. At the operating speeds preferred, on the order of 100 mc., the diodes are subject to relatively high reverse voltages. For this reason, it is necessary to select diodes which have very small charge storage effects. One of the very few diodes which meet this requirement is the Hughes diode type HD5001. It is also possible to design shunt connected limiting circuits, but since the diode impedances are generally greater than 10 ohms, such a configuration usually requires an impractically large load impedance.

Minimum specifications for a limiter operating on a three input majority gate may be derived. It is assumed that each signal has a tolerance of $\pm\Delta$. The extreme limits of the sum of the three input signals are then $(1-3\Delta)$ and $3(1+\Delta)$ if unity is taken as the reference level of the nominal signal. The limiter must be capable of generating an output signal which varies by no more than $(1\pm\Delta)$. The limiting ratio L of the high and low attenuation of the limiter may be computed. It may readily be shown that L has a minimum of 23.4 db for a tolerance $\Delta=\pm0.155$. This figure for L indicates the required quality of the minimum acceptable limiter. The limiter of FIGURE 6 employs a pair of junction-diodes with a backward recovery time of less than 0.1 used in the series mode. The limiting ratio L is essentially the ratio of the backward impedance of the diode and the load impedance.

Figure 7A:
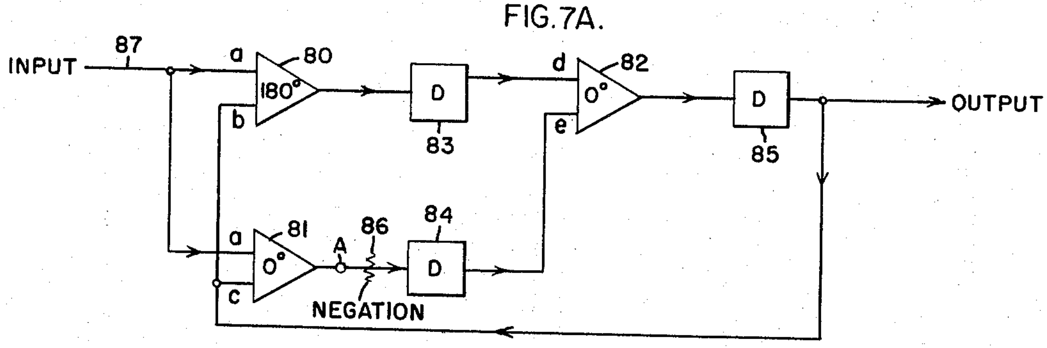
FIGURE 7A is a block diagram of a flip-flop circuit incorporating an assemblage of logic gain elements shown in FIGURE 2.

FIGURE 7A is a block diagram of a novel flip-flop circuit having essentially a single input line to which pulses coded in phase are fed in time sequence. The flip-flop is arranged to provide at its output pulses also coded in phase, and to operate generally in a manner analogous to a non-free-running bistable multi-vibrator. The circuit is adapted to switch from one phase output condition to the alternate phase output condition upon the occurrence of a "1" in the input.

The block diagram may be seen to include first, second and third logic gain components 80, 81, and 82, each of the general nature illustrated in FIGURE 2. The components 81 and 82 are arranged to provide an AND gate function as explained while the component 80 is arranged to provide an OR gate function. The input signals are applied simultaneously from the bus 87 to a first input terminal of the components 80 and 81.

The outputs of the logic gain elements 80 and 81, and are applied to half bit relay elements 83 and 84, the connection between the logic gain component 81 and delay element 84 including a negation element 86 which reverses the phase of the signal. The logic gain component 82 receives as separate inputs the outputs of the delay elements 83 and 84. The output of the flip-flop is available from logic gain component 82 after a further half bit delay provided by delay element 85. The output is also fed back to the inputs of logic gain components 80 and 81 by the illustrated connection. Therefore, the output signal is applied simultaneously with the next input signal to the logic gain components 80 and 81. One might obtain the same time relationships by doubling the delay in element 85 and eliminating delay elements 83 and 84 or by doubling the delay in elements 83 and 84 and eliminating 85.

An example of the operation is as follows: Assuming an output value of "0" upon receiving a "1" as an input at *a* and a "0" from the output at *b* and *c*, the components 80 and 81 produce "1" and "0" signals as a result of the OR gate and AND gate operations, respectively. After negation of the "0" signal by the negation element 86, the two "1" signals are each delayed a half bit and applied to the input *d* and *e* of the component 82. As a result of the AND gate operation and the half bit delay by element 85, the output becomes a "1."

A general expression for the operation of the center-point triggered flip-flop can be obtained from the following logic equations expressed in terms of the inputs to the various components wherein the subscript on $c_0$ indicates the output from the cycle prior to $c_1$:

| Mathematical Equation | Literal Interpretation |
|---|---|
| $d=D(a+b)$ | $d$=delay of ($a$ or $b$). |
| $\bar{e}=D(ac_0)$ | Negation of $e$=delay of ($a$ and $c_0$). |
| $b=c_0=D(de)$ | $b=c_0$=output=delay of ($d$ and $e$). |
| $c^1=2D(a+b)(\overline{ac_0})=2d(a\bar{c}_0+\bar{a}c_0)$ | Output=delay of one bit of ($a$ and not $-c_0$ or not $-a$ and $c_0$). |

Thus (the phase of the output signal will be reversed whenever the input signal is of "$\pi$" phase relationship.

Figure 7B:
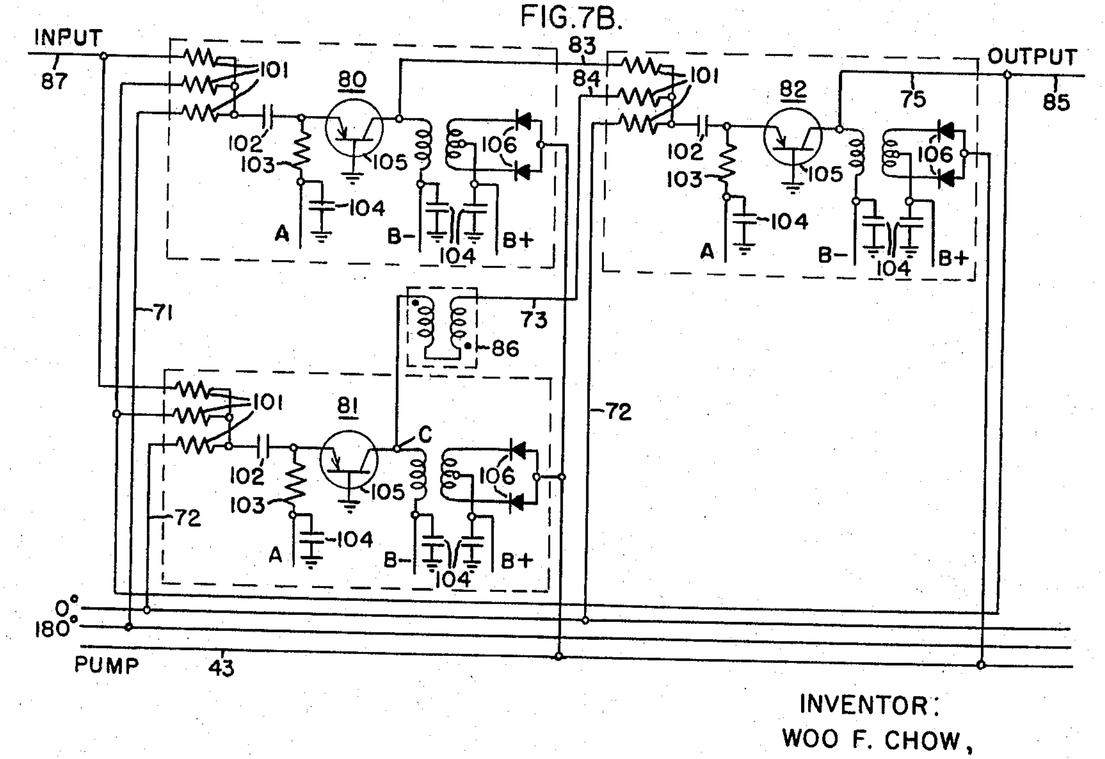
FIGURE 7B is a circuit diagram of the flip-flop circuit of FIGURE 7A.

FIGURE 7B is a detailed circuit diagram of the flip-flop shown in FIGURE 7A. This circuit is composed of elements as described above. Lines 83–85 provide additional time delays so that the total delay between logic gain elements is of one half bit and lines 71 and 72 are connected to 100 mc. sinusoidal supply busses at 180° and 0° phases, respectively. The following parameters may be employed in the arrangement shown, but, of course, it is to be understood that they are merely for the guidance of one desiring to practice the invention and the invention is not to be limited thereby:

| | |
|---|---|
| Resistances **101** | 51Ω. |
| Capacitors **102** | 510 $\mu\mu$f. |
| Resistances **103** | 510Ω. |
| Capacitors **104** | 510 $\mu\mu$f. |
| Transistor **105** | 2N502. |
| Parametric diodes **106** | Pacific semiconductor Pc–115–10. |
| Bus A | 3 ma. |
| Bus B+ | 0.8 v. |
| Bus B− | −4.6 v. |
| Pump bus | 200 mc. |

The operating point of the transistors is selected to provide symmetrical clipping at the signal levels involved. This as explained below, has the effect of improving the output waveforms by emphasizing harmonics attenuated by the band pass limitations of the network.

It is further noted that the flip-flop circuit illustrated in FIGURE 7A and FIGURE 7B also presents an output at the terminal C which is that of a scale of two counter. The output will be "$\pi$" phase signal if the input is "$\pi$" phase and only if in the preceding digit period there has been a "$\pi$" output signal from the flip-flop.

Therefore, the disclosed flip-flop configuration produces two outputs. One output, obtained on line 85, corresponds to the conventional bistable flip-flop output where set and reset inputs are applied at the same, center-point input terminal. The second output, obtained at terminal A, corresponds to a scale of two counter output.

The parametric logic gain components employed in FIGURE 7 make possible the attainment of speeds of response hitherto unattained. These components are uniquely adapted to function in precise timed relationship, by virtue of the inherent synchronism of the "degenerate" case amplifiers, a property which greatly reduces the problems of "clocking" the sparate components.

It is to be understood that the invention is not to be considered limited to 0° and 180° phase binary information systems. Other radices and/or phase coding arrangements are possible such as ternary coding and binary coding at 0° and 60° phase, etc. The relation of one bit per one cycle of information is not absolute, that is, a larger integral number of cycles may be used. All of these factors tend to affect the bandwidth requirements or transient response required of the parametric amplifier.

The essential importance of using the degenerate case parametric amplifier is the inherent synchronous action thereof as between the signal and the pump. This property taken together with the distinct wave reforming property of the parametric amplifier is of particular benefit in applicant's novel gain component.

While the fundamental novel features of the invention have been shown and described as applied to illustrative embodiments, it is to be understood that the invention is not to be limited thereto. The true scope of the invention, including those variations apparent to one skilled in the art is defined in the following claims.

What is claimed is:

1. In combination: means for supplying a digital signal consisting of a sinusoidal wave of a predetermined frequency having an arbitrary, low integral number, including one of full cycles per bit coded in phase; logic means responsive thereto and adapted to perform a logic operation thereon producing an output signal in phase coding; high fractional bandwidth parametric amplifying means operative at the degenerate case having identical input and output frequencies, said parametric amplifying means having a terminal at which both input and output signals appear; and isolating means interposed between said logic means and said parametric amplifying means for providing only forward signal propagation from said logic means to said parametric amplifying terminal.

2. The combination of claim 1 wherein limiting means are provided introduced between said logic means and said parametric amplifying means for limiting the signal supplied to the latter means.

3. In combination: means for supplying a digital input signal of a predetermined frequency coded in phase; logic means responsive thereto and adapted to perform a logic operation thereon producing a logic signal in phase coding, a degenerate case parametric amplifying means adapted to receive said logic signal as an input at a common terminal and produce at said common terminal a synchronized output signal at the same frequency as said logic signal; a transistor connected between said logic means and said common terminal to provide only forward signal propagation from said logic means to said common terminal; and a limiter connected to said common terminal to limit said logic signal input and thereby provide constant amplitude output signals.

4. In combination: means for supplying a digital input signal of a predetermined frequency coded in phase; logic means responsive thereto and adapted to perform a logic operation thereon producing a logic signal in phase coding, degenerate case parametric amplifying means adapted to receive said logic signal as an input at a common terminal and produce at said common terminal an amplified and synchronized output signal at the same frequency as said logic signal; unilateral isolating means interposed between said logic means and said common terminal for providing only forward signal propagation from said logic means to said common terminal; and a limiter connected to said common terminal to limit said logic signal input and thereby provide constant amplitude output signals.

5. In combination: means for supplying a digital input signal of a predetermined frequency coded in phase; logic means responsive thereto and adapted to perform a logic operation thereon producing an output signal in phase coding; parametric amplifying means having a bandwidth approximately equal to or greater than a normalized bandwidth of one at said predetermined frequency, adapted to amplify said output signals, and having a terminal at which both input and output signals appear; isolating means interposed between said logic means and said parametric amplifying means for providing gain and only forward signal propagation from said logic means to said parametric amplifying terminal; and a limiter connected to said terminal to limit said logic signal input and thereby provide constant amplitude output signals.

6. The combination of claim 5 wherein said signal is a binary signal coded at 0 and $\pi$ phases with a bit period of one cycle.

7. A logic gain component comprising: a logic matrix responsive to phase coded input signals at a predetermined frequency providing a majority logic signal in phase coding; a parametric amplifier having an input-output terminal, and including a pump source providing a pump wave at twice said predetermined frequency; a nonlinear reactive element energized by said pump source; a resonant circuit coupled to said nonlinear element, resonant at said predetermined frequency for amplifying signals at said frequency; an isolator connected between said logic matrix and said input-output terminal providing gain and only forward signal propagation from said matrix to said terminal; and a limiter connected to said input-output terminal to provide constant amplitude input signals to said parametric amplifier for stabilization of the output thereof.

8. A logic gain component comprising: logic means responsive to input signals of a predetermined frequency in phase coding and adapted to perform a logic operation thereon and to provide at the output thereof signals also in phase coding; degenerate case parametric amplifying means adapted to synchronize and reshape signals at said predetermined frequency having a terminal at which both input and output signals appear; isolating means interposed between said logic means and said parametric amplifying means for providing only forward signal propagation from said logic means to said parametric amplifying terminal; and a limiter connected to said terminal to provide constant amplitude input signals to said parametric amplifying means for stabilization of the output thereof.

9. A logic gain component comprising: a resistance matrix providing a majority sum signal in phase coding as the sum of an odd number of high frequency phase coded input signals; a pump supplying a pump wave at twice the frequency of said input signals; a bridge-like parametric amplifier resonant at half the pump frequency comprising a center tapped inductor; a pair of parametric diodes; the first diode having a first pole connected to one end of said inductor, and the second diode having a second like pole connected to the other end of said inductor, said pump being connected between the center tap of said inductor and the remaining poles of said diodes; an input-output parametric amplifier terminal; a second inductor coupled between said amplifier terminal and ground in such a manner as to provide, together with the inherent stray capacitance of the circuit, a parallel resonant circuit resonant at approximately the signal frequency and coupled inductively with said first inductance; an isolator connected between said matrix and said amplifier terminal providing gain and only forward signal propagation from said matrix to said terminal and a limiter connected to said amplifier terminal to provide constant amplitude input signals to said parametric amplifier for stabilization of the output thereof.

10. A logic gain component comprising: an analog summation matrix providing a majority sum signal in phase coding as the sum of an odd number of high frequency phase coded input signals; a pump bus supplying a pump wave at twice the frequency of said input signals; a transformer having a primary winding and two secondary windings; means connecting said pump bus to said primary winding; means connecting the proximate terminals of each of the secondary windings of said transformer to a source of opposite polarity d.c. bias voltage; a pair of parametric diodes series connected between the remaining terminals of the secondary windings of said transformer and poled in the same direction; a transistor connected between said summation matrix and the junction of said parametric diodes for providing gain and only forward signal propagation from said matrix to said diodes; and a limiter connected to said junction of said diodes to provide constant amplitude input signals to said diodes, said limiter including a pair of junction-diodes poled in opposite directions and connected in series with the output signal.

References Cited by the Examiner

UNITED STATES PATENTS

| | | | |
|---|---|---|---|
| 3,002,108 | 9/1961 | Sterzer | 307—88 |
| 3,084,264 | 4/1963 | Kosonacky | 307—88 |
| 3,171,971 | 3/1965 | Heizman | 307—88 |

BERNARD KONICK, *Primary Examiner.*

IRVING SRAGOW, *Examiner.*

M. S. GITTES, J. W. MOFFITT, *Assistant Examiners.*